United States Patent
Masai et al.

(10) Patent No.: US 9,831,418 B2
(45) Date of Patent: Nov. 28, 2017

(54) PIEZOELECTRIC COMPOSITION AND PIEZOELECTRIC ELEMENT

(71) Applicant: TDK CORPORATION, Tokyo (JP)

(72) Inventors: Taku Masai, Tokyo (JP); Masahito Furukawa, Tokyo (JP); Hiroki Katoh, Tokyo (JP)

(73) Assignee: TDK CORPORATION, Tokyo (JP)

( * ) Notice: Subject to any disclaimer, the term of this patent is extended or adjusted under 35 U.S.C. 154(b) by 534 days.

(21) Appl. No.: 14/610,321

(22) Filed: Jan. 30, 2015

(65) Prior Publication Data

US 2015/0221858 A1 Aug. 6, 2015

(30) Foreign Application Priority Data

Feb. 5, 2014 (JP) .................. 2014-020296
Dec. 16, 2014 (JP) .................. 2014-253868

(51) Int. Cl.
| | |
|---|---|
| *H01L 41/187* | (2006.01) |
| *H01L 41/18* | (2006.01) |
| *H01L 41/08* | (2006.01) |
| *H01L 41/083* | (2006.01) |
| *H01L 41/316* | (2013.01) |

(52) U.S. Cl.
CPC .......... *H01L 41/1878* (2013.01); *H01L 41/18* (2013.01); *H01L 41/083* (2013.01); *H01L 41/0805* (2013.01); *H01L 41/316* (2013.01)

(58) Field of Classification Search
CPC ............................ H01L 41/1878; H01L 41/18
USPC ........ 310/358; 252/62.9 PZ, 62.9 R; 501/132
See application file for complete search history.

(56) References Cited

U.S. PATENT DOCUMENTS

| | | | |
|---|---|---|---|
| 2012/0187325 A1 | 7/2012 | Hoffmann et al. | |
| 2013/0153812 A1 | 6/2013 | Jeon et al. | |
| 2013/0193367 A1* | 8/2013 | Masai | C04B 35/475 252/62.9 PZ |
| 2016/0141486 A1* | 5/2016 | Masai | H01L 41/1878 310/311 |

FOREIGN PATENT DOCUMENTS

| | | |
|---|---|---|
| CN | 101200370 A | 6/2008 |
| CN | 103119743 A | 5/2013 |
| JP | 2013-500919 A | 1/2013 |

\* cited by examiner

*Primary Examiner* — Thomas Dougherty
(74) *Attorney, Agent, or Firm* — Oliff PLC

(57) ABSTRACT

The present invention aims to provide a piezoelectric composition and a piezoelectric element. In the piezoelectric composition, the main component is represented by the following formula with a perovskite type structure, $$(Bi_{(0.5x+y+z)}Na_{0.5x})_m(Ti_{(x+0.5y)}Mg_{0.5y}Me_z)O_3$$

wherein, $0.05 \leq x \leq 0.7$, $0.01 \leq y \leq 0.7$, $0.01 \leq z \leq 0.6$, $0.75 \leq m \leq 1.0$, $x+y+z=1$ and the transition metal element Me is any one or more selected from the group consisting of Mn, Cr, Fe and Co.

2 Claims, 2 Drawing Sheets

PIEZOELECTRIC COMPOSITION AND PIEZOELECTRIC ELEMENT

The present invention relates to a piezoelectric composition and a piezoelectric element widely used in fields such as a piezoelectric sounder, a piezoelectric sensor, a piezoelectric actuator, a piezoelectric transformer or a piezoelectric ultrasonic motor or the like.

BACKGROUND

A piezoelectric element with a piezoelectric composition used therein has an effect of generating a deformation when an external electric field is applied, and also has an effect of generating electric charges on the surface when it receives an external stress. Recently, such a piezoelectric element is widely used in various fields. For example, a piezoelectric element which uses a piezoelectric composition such as lead zirconate titanate ($Pb(Zr,Ti)O_3$:PZT) and the like will deform in proportion to the applied electric voltage with the displacement value being in a level of about $1 \times 10^{-10}$ m/V. Thus, such a piezoelectric element is excellent in fine position adjustment and can be further used for fine adjustment in an optical system.

Besides, on the other hand, as a piezoelectric composition will generate electric charges in proportion to the applied stress or the deformation caused by the stress, it also can be employed as a sensor for detecting minute forces or the extent of deformations.

Furthermore, a piezoelectric composition has an excellent responsiveness. Thus, when an alternating current field is applied, resonance could occur due to the excitation of the piezoelectric composition itself or an elastic body coupled with the piezoelectric composition. In this respect, the piezoelectric composition can also be used as a piezoelectric transformer, a ultrasonic motor and etc.

Currently, most of the piezoelectric compositions in practical use are solid solutions (PZT-based) composed of $PbZrO_3$(PZ)—$PbTiO_3$(PT). The piezoelectric compositions meeting various needs can be widely developed by adding various accessory ingredients or additives into the PZT-based piezoelectric composition.

There are different piezoelectric compositions such as a piezoelectric composition with a low mechanical quality factor (Qm) and a high piezoelectric constant (d), and a piezoelectric composition with a low piezoelectric constant (d) and a high mechanical quality factor (Qm). The previous one is used in an actuator or the like for position adjustment which seeks a large displacement via a direct current usage. The latter one is applicable to alternating current related uses. For example, the latter one is used in an ultrasonic generating element such as an ultrasonic motor.

In addition, there are substances other than PZT-based ones that can be used as piezoelectric compositions, most of which are solid solutions using a lead based perovskite component such as lead magnesio-niobate ($Pb(Mg,Nb)O_3$: PMN) or the like as the main component.

However, these lead based piezoelectric compositions contain about 60 to 70 mass % of lead oxides and the lead oxides have an extremely high volatility even at a low temperature. If the influence on the environment is considered, it is expected that less lead oxides will be used.

Therefore, the lead-free piezoelectric composition will become an extremely important issue if the piezoelectric ceramics and the piezoelectric single-crystals are to be applied to more fields and to be used in more amounts.

As for a lead-free piezoelectric composition, for example, barium titanate ($BaTiO_3$), the bismuth layered ferroelectric or the like are well known.

However, since the barium titanate has a curie point as low as 120° C. and its piezoelectric property will disappear at a temperature higher than 120° C., it will not be practical if considering that it is bonded by welding or used in vehicles.

On the other hand, although the bismuth layered ferroelectric usually has a curie point of 400° C. or higher and is excellent in thermal stability, its crystal anisotropy is high. Thus, it is necessary to use a method, such as hot forging method, in which spontaneous polarization is oriented by applying shear stress while firing and sintering. Hence, problems arise in the aspect of productivity.

Recently, the bismuth sodium titanate based composition is being studied as a new piezoelectric composition. For instance, Patent Document 1 has disclosed a piezoelectric ceramic composition containing bismuth sodium titanate.

The piezoelectric ceramic composition in Patent Document 1 contains a matrix material and the matrix material contains at least two matrix components with a perovskite structure. Or, the piezoelectric ceramic composition is only composed of the matrix component. Further, a piezoelectric ceramic composition is disclosed, in which a first matrix component is selected from the group consisting of $(Bi_{0.5}A_{0.5})EO_3$ and $BaEO_3$ and the other matrix component is $Bi(Me_{0.5}E_{0.5})O_3$, wherein A represents an alkali metal and is especially selected from the group consisting of sodium, potassium and a mixture of alkali metals, E is independently selected from titanium, zirconium and their mixture, and Me is selected from the group consisting of bivalent metals.

PATENT DOCUMENT

Patent Document 1: JP-A-2013-500919

SUMMARY

However, the piezoelectric composition disclosed in Patent Document 1 is composed of a first matrix component selected from a group consisting of $(Bi_{0.5}A_{0.5})EO_3$ and $BaEO_3$ and the other matrix component which is $Bi(Me_{0.5}E_{0.5})O_3$. The piezoelectric ceramic can obtain a high dielectric constant but it can not obtain the sufficient properties such as spontaneous polarization or piezoelectric displacement for the reason that the ratio of a axis and c axis (which is referred to as tetragonality) in the perovskite structure is not big enough. Especially, when the piezoelectric composition is used in a piezoelectric sensor or a piezoelectric actuator, the spontaneous polarization is required to be large enough. Further, in the piezoelectric actuator, it becomes important that the piezoelectric displacement is large.

The present invention is made in view of the above problems and the aim is to provide an excellent piezoelectric composition and an excellent piezoelectric element even from the viewpoint of low pollution, environment-friendliness and ecology by preparing a compound with a high spontaneous polarization and a large piezoelectric displacement in the lead-free composition.

In order to solve the above technical problems, the inventors of the present invention carried out the studies of the piezoelectric composition showing good piezoelectric properties by using a bismuth sodium titanate based composition, and found a piezoelectric composition which is different from the conventional composition range.

The piezoelectric composition is characterized in that the main component is the material represented by the following formula with a perovskite type structure.

$$(Bi_{(0.5x+y+z)}Na_{0.5x})_m(Ti_{(x+0.5y)}Mg_{0.5y}Me_z)O_3$$

$0.05 \leq x \leq 0.7$,
$0.01 \leq y \leq 0.7$,
$0.01 \leq z \leq 0.6$,
$0.75 \leq m \leq 1.0$,
(Wherein, x+y+z=1 and the transition metal element Me is any one or more selected from the group consisting of Mn, Cr, Fe, and Co.)

With the ranges mentioned above, the piezoelectric displacement and the spontaneous polarization can be improved.

Besides, a piezoelectric element using the above piezoelectric composition can be provided such as a piezoelectric element used in an ink jet head or a piezoelectric actuator in which the displacement of the actuator is quite large.

A piezoelectric sensor using the above piezoelectric composition can be provided such as a piezoelectric element with a long measurement range and a high sensitivity that is used in ultrasonic sensors, the representative of which are a sensor for measuring the distance between vehicles (this sensor is used in an auto-parking system) and a fluid level sensor.

A film piezoelectric device using the above piezoelectric composition can be provided such as a piezoelectric gyro, an acceleration sensor or a piezoelectric film pump. With the excellent piezoelectric properties, a high sensitivity of the sensor can be obtained in the piezoelectric gyro or the acceleration sensor. Also, a high pump flow quantity can be achieved in the piezoelectric pump.

As described above, the piezoelectric composition according to the present invention has advantages of a high spontaneous polarization and a large piezoelectric displacement, and thus the excellent piezoelectric properties can be obtained. Besides, since no lead is used, such a piezoelectric composition is extremely excellent if low pollution, environment-friendliness and ecology are considered.

DETAILED DESCRIPTION OF EMBODIMENTS

Figure 1:
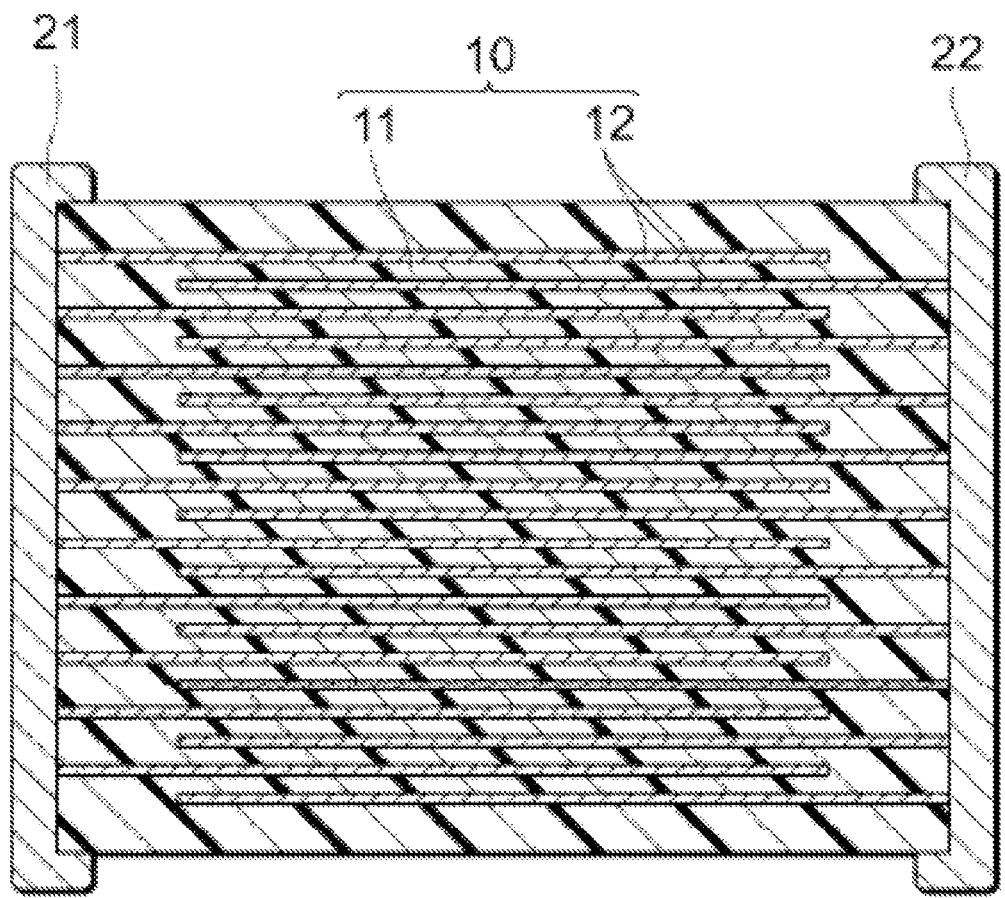
FIG. 1 is a schematic drawing showing the cross-section of the laminated piezoelectric element.

Hereinafter, the embodiments of the present invention will be described in detail.

The piezoelectric composition of the first embodiment in the present invention is characterized in that the main component is represented by the following formula with a perovskite type structure.

$$(Bi_{(0.5x+y+z)}Na_{0.5x})_m(Ti_{(x+0.5y)}Mg_{0.5y}Me_z)O_3$$

$0.05 \leq x \leq 0.7$,
$0.01 \leq y \leq 0.7$,
$0.01 \leq z \leq 0.6$,
$0.75 \leq m \leq 1.0$,
(Wherein, x+y+z=1 and the transition metal element Me is any one or more selected from the group consisting of Mn, Cr, Fe, and Co.)

The range of x is preferably $0.05 \leq x \leq 0.7$. When x is less than 0.05, it is hard to form the perovskite structure. On the other hand, it is hard to obtain sufficient spontaneous polarization and piezoelectric displacement when x is more than 0.7.

Furthermore, the range of y is preferred to be $0.01 \leq y \leq 0.7$. When y is more than 0.7, heterogeneous phase other than perovskite phase will be generated. As the generation of the heterogeneous phase, the spontaneous polarization and the piezoelectric displacement will be decreased, or the electric resistivity will reduce. On the other hand, when y is less than 0.01, it is hard to obtain sufficient spontaneous polarization and piezoelectric displacement.

Besides, the range of z is preferably $0.01 \leq z \leq 0.6$. When z is more than 0.6, the piezoelectric properties, especially the spontaneous polarization and the piezoelectric displacement, will be decreased accompanied with the generation of the heterogeneous phase. On the other hand, when z is less than 0.01, it is difficult to sinter under a low temperature and the density of the sintered body will decrease.

The m in the formula above represents the ratio of A to B in the entire piezoelectric composition. If m is 1 or less, the sinterability can be improved and better piezoelectric properties can be obtained. However, if m is less than 0.75, crystalline phases other than the perovskite-typed phase (i.e., heterogeneous phases) will generate, which will make the piezoelectric properties worse. Thus, m is preferred to be within the range of 0.75 or more and 1.0 or less. Moreover, if m is less than 0.75, the resistivity may reduce due to the generation of the heterogeneous phases.

The piezoelectric composition of the present embodiment contains a first compound of bismuth sodium titanate, a second compound of bismuth-magnesium-titanium composite oxides, and a third compound of a perovskite compound composed of transition metal element Me and bismuth. These three components are deemed as the main component.

That is, the piezoelectric composition contains the first compound, the second compound and the third compound. These three compounds are subjected to be solid solution. And they also can be a partial solid solution.

The piezoelectric composition can be represented by the following formula if the chemical formulae of the first, the second and the third compounds are used.

The piezoelectric composition is characterized in that it can be represented by the following formula.

$$x(Bi_{0.5}Na_{0.5})_{s1}TiO_3 - yBi_{t1}(Mg_{0.5}Ti_{0.5})O_3 - zBi_{u1}MeO_3 \quad (1)$$

$0.05 \leq x \leq 0.7$,
$0.01 \leq y \leq 0.7$,
$0.01 \leq z \leq 0.6$,

Wherein, x+y+z=1 and s1, t1, u1 are 0.75 or more and 1.0 or less.

The bismuth sodium titanate can be listed as the first compound of the above formula 1. The composition of bismuth sodium titanate can be represented by the following formula 2, wherein the sodium and the bismuth are located at the A site of the perovskite structure, and the titanium is located at the B site of the perovskite structure.

$$(Bi_{0.5}Na_{0.5})_{s1}TiO_3 \quad (2)$$

In the above formula 2, s1 represents the composition ratio obtained from the molar ratio of the elements at A site to those at B site (hereinafter referred to as the ratio of A to B). However, if s1 is 1 or less, the sinterability will be improved and the higher spontaneous polarization and piezoelectric displacement will be obtained, thus it is preferred. And s1 is more preferably 0.75 or more and 1.0 or less for higher spontaneous polarization and piezoelectric displacement can be obtained. The constituent amounts of sodium, bismuth and oxygen can be calculated according to the stoichiometric composition. However, they can also deviate from the stoichiometric composition.

As the second compound of the formula 1, the bismuth-magnesium-titanium composite oxides can be listed. The composition of the bismuth-magnesium-titanium composite oxides is shown by the following formula 3, wherein bismuth is located at A site of the perovskite structure, and magnesium and titanium are located at B site of the perovskite structure.

$$Bi_{t1}(Mg_{0.5}Ti_{0.5})O_3 \quad (3)$$

In the above formula 3, t1 represents the ratio of A to B. If t1 is 1 or less, the sinterability will be improved, and higher spontaneous polarization and piezoelectric displacement will be obtained, thus it is preferred. And t1 is more preferably 0.75 or more and 1.0 or less for the reason that higher spontaneous polarization and piezoelectric displacement can be obtained. The constituent amounts of magnesium, bismuth and oxygen can be calculated according to the stoichiometric composition. However, they can also deviate from the stoichiometric composition.

As the third compound, a perovskite compound composed of the transition metal element Me and bismuth can be listed. However, the transition metal element Me is any one or more selected from the group consisting of Mn, Cr, Fe, and Co. The composition of the compound is represented by the formula 4, wherein bismuth is located at A site of the perovskite structure, and the transition metal element Me is located at B site of the perovskite structure.

$$Bi_{u1}MeO_3 \quad (4)$$

In the above formula 4, u1 represents the ratio of A to B. However, if u1 is 1 or less, the sinterability can be improved and better piezoelectric properties can be obtained, and thus it is preferred. Besides, u1 is more preferably 0.75 or more and 1.0 or less because better piezoelectric properties are obtainable. The constituent amounts of the transition metal element Me, bismuth and oxygen can be calculated according to the stoichiometric composition. However, they can also deviate from the stoichiometric composition.

With respect to the s1, t1 and u1, as $xs1+yt1+zu1=m$, m can satisfy $0.75 \leq m \leq 1.0$.

The $(Bi_{0.5}Na_{0.5})TiO_3$ has a rhombohedral perovskite structure, $Bi(Mg_{0.5}Ti_{0.5})O_3$ has an orthorhombic perovskite structure, and $BiMeO_3$ has a tetragonal perovskite structure. Therefore, similar to the PZT based piezoelectric composition, the piezoelectric composition of the present invention has a structure close to the crystallographic phase boundary (morphotropic phase boundary) so that excellent piezoelectric properties can be obtained.

Further, $(Bi_{0.5}Na_{0.5})TiO_3$ is a ferroelectric and it becomes a relaxor ferroelectric by forming a solid solution together with $Bi(Mg_{0.5}Ti_{0.5})O_3$. However, when it becomes a relaxor material, no domain structure is observed, and only the unstable polarization that is called as the polar-nano-region might be present. By forming a solid solution together with $BiMeO_3$ which is a ferroelectric, the domain with a submicron size can be stably formed. The increase of the domain is related with the increase of spontaneous polarization. Furthermore, $BiMeO_3$ has a high tetragonality (i.e., c/a). Thus, when an electric field is applied, the travel distance of the ions becomes larger by means that this material is subjected to the solid-solution treatment. As a result, large spontaneous polarization and piezoelectric displacement can be obtained.

In the present embodiment, the first, the second and the third compounds are used as the main components. Preferably, they account for 90% or more of the piezoelectric composition. Further, besides the elements constituting the first, the second and the third compounds, impurities or constituent elements of other compounds can be contained in the amount of about several tens to several hundreds of ppm. Ba (barium), Sr (strontium), Ca (calcium), Li (lithium), Hf (hafnium), Ni (nickel), Ta (tantalum), Si (silicon), B (boron) and rare earth elements can be listed as such elements.

In addition, the piezoelectric composition of the present embodiment may contain lead as the impurity. The content of lead is preferably 1 mass % or less, and more preferably no lead is contained. It is because that the volatilization of lead in the sintering process and the discharge of the lead into the environment after it is distributed in the market as a piezoelectric component and then abandoned can be inhibited to be a minimum, and thus it is preferred from the viewpoint of low pollution, environment-friendliness and ecology.

Further, the piezoelectric composition of the present invention preferably comprises a compound as the accessory component and this compound contains at least one element selected from the group consisting of Cu and Al. The total amount of the accessory component is preferably 0.04 to 0.6 mass % based on the whole main components if the calculation is performed based on elements.

The piezoelectric composition with such a composition can be prepared as follows. First of all, powders of bismuth oxide, sodium carbonate, titanium oxide, iron oxide, cobalt oxide, magnesium carbonate and etc. are prepared as the starting materials in accordance with needs. After sufficiently dried at a temperature of 100° C. or higher, these powders are weighted based on the target composition. In addition, with respect to the starting materials, substances such as carbonates or oxalates which will turn to oxides via a firing process can be used to replace the oxides, and also oxides or other substances which will turn to oxides by firing can be used instead of the carbonates.

Next, the weighted starting materials are sufficiently mixed for 5 hours to 20 hours in an organic solvent or water by using an instrument such as a ball mill. Thereafter, the mixture is sufficiently dried, subjected to a press molding, and then calcined at a temperature of 650° C. to 700° C. for about 1 hour to 3 hours. Then, the calcined substance is milled in an organic solvent or water by a ball mill for 5 hours to 30 hours. The obtained materials are dried again and subjected to a granulation process with the addition of a binder solution. Then, a press molding process is provided to the powders after the granulation process so that the powders are produced into blocks.

After produced into blocks, the molded body is subjected to a thermal treatment at a temperature of 400° C. to 600° C. for about 2 hours to 4 hours so that the binder will volatilize. Then, the sintering process is performed at a temperature of 800° C. to 1000° C. for about 2 hours to 4 hours. The heating rate and cooling rate in the sintering process are both, for example, about 50° C./hour to 300° C./hour. After the sintering process, the obtained sintered body is polished according to needs and electrodes are disposed. Thereafter, the resultant is polarized for about 5 minutes to 1 hour in a silicone oil of 25° C. to 150° C. with an applied electric field of 5 mV/m to 10 mV/m. Thus, the piezoelectric composition mentioned above is obtained.

The average particle diameter of the grains in the piezoelectric composition obtained via the method described above is about 0.5 μm to 20 μm.

FIG. 1 shows a structure example of the piezoelectric element using the piezoelectric composition according to the present embodiment. This piezoelectric element has a laminated body 10 in which multiple piezoelectric layers 11 composed of the piezoelectric composition of the present embodiment and multiple internal electrodes 12 are alternatively laminated. Each piezoelectric layer 11 has a preferable thickness of, for example, about 1 μm to 100 μm. The number of the piezoelectric layers 11 may be determined in accordance with the target displacement value.

For example, such a piezoelectric element can be prepared as follows. Firstly, after calcined powders are prepared by using the same method as that for the piezoelectric composition described above, vehicles are added. They are mixed to prepare the paste for the piezoelectric layer.

Then, in order to form the internal electrodes 12, the conductive material and the vehicles are mixed. Otherwise, various oxides or organometallic compounds which will turn to conductive materials after a firing process are mixed with the vehicles. In this way, the paste for the internal electrodes is prepared. The conductive material is not particularly limited. For example, the conductive material is preferably at least one selected from the group consisting of silver (Ag), gold (Au), platinum (Pt), copper (Cu), nickel (Ni) and palladium (Pd), or the alloy thereof. In addition, besides these components, the internal electrode 12 may further contain various trace components such as phosphorus (P) with an amount of about 0.1 wt % or less. The thickness of the internal electrode 12 is preferred to be, for example, about 0.5 μm to 3 μm.

In addition, additives such as dispersing agent, plasticizer, dielectric material or insulating material can be added into the paste for the internal electrode if necessary.

The paste for the piezoelectric layer and the paste for the internal electrode obtained by the above steps are used to prepare a green chip as the precursor of the laminated body 10 through, for example, a print method or a sheet method.

After a debindering process is applied to the green chip which is prepared by the steps mentioned above, the green chip is sintered to form the laminated body 10.

The end surfaces in the laminated body 10 obtained by the above steps are polished by barrel-polishing or sandblasting. The paste for the terminal electrodes which is prepared by a same process with that of the paste for the internal electrodes is printed or gravure-printed, and then fired. Thus, the terminal electrodes 21 and 22 are formed. The paste for the terminal electrodes contains, for example, the conductive material, glass flit and vehicle. The conductive material contains at least one selected from the group consisting of Ag, Au, Cu, Ni, Pd and Pt. The vehicle is an organic vehicle or an aqueous vehicle, wherein the organic vehicle is one obtained by dissolving the binder in the organic solvent, and the aqueous vehicle is one obtained by dissolving the water-soluble binder and the dispersing agent in water. In this way, the piezoelectric laminated element shown in FIG. 1 is obtained.

The preparation method described above is called as a solid-phase reaction method. A vapor phase growth method can be listed as other representative method of the present embodiment.

The vapor phase growth method is a process in which the starting material (i.e., target material) is vaporized in a vacuum chamber to form a film with a thickness of about several tens of nanometers to several microns on a smooth substrate.

The vapor phase growth method can be sputtering, evaporation, pulsed laser deposition and the like. With these methods, a dense film can be formed in an atomic level and segregation will hardly occur.

In the vapor phase growth method, the starting material (target material) is physically vaporized and then deposited on the substrate. The excitation source varies according to the film-forming method. When the sputtering method is used, Ar plasma becomes the excitation source. When it is the evaporation method, electron beam is the excitation source. If the pulsed laser deposition is used, the laser will be the excitation source and will irradiate the target.

As described above, there are several methods for preparing thin film of the piezoelectric film in the vapor phase growth. As a representative example, the pulsed laser deposition method will be described.

In a vacuum chamber, the substrate for thin film forming is heated at a temperature of 500° C. to 800° C. The substrate is heated while the vacuum degree is kept at a high vacuum condition reaching a pressure of $1 \times 10^{-3}$ to $1 \times 10^{-5}$ Pa so that the cleanliness of the surface will be improved.

During the film deposition process, the laser irradiates the target material. The evaporation of the target material due to the radiation of the laser will make the film deposited on the substrate.

As for the control factors besides the temperature of the substrate, there are power of the laser, the concentration degree of the laser, the distance between the substrate and the target and the like. The desired properties will be obtained by controlling these parameters.

In addition, in order to supplement oxygen during the film deposition of oxides, the oxygen gas is circulated preferably under an oxygen pressure of $1 \times 10^{-1}$ to $1 \times 10^{-5}$ Pa. If a higher oxygen pressure is used, the rate of the film deposition will decrease.

The target material which is used as the starting material for the film deposition can be a sintered body prepared by the solid-phase reaction. When such a vapor phase growth method is used, the piezoelectric composition of the present invention is usually formed on the Si substrate or the MgO substrate or the $SrTiO_3$ substrate or the like. If the piezoelectric composition is deposited on the Si substrate, the Pt lower electrode is deposited as a film after a film of the adhesion layer of Ti or Cr or the like is deposited.

As the method for yielding a polycrystalline film, there is a method in which the substrate is heated while making the crystal grow at the same time. In another method, the polycrystalline film is obtained by forming a film at room temperature and then firing at a desired temperature. When the film deposition is carried out at room temperature, the desired crystalline phases can be obtained by depositing the piezoelectric material and then appropriately applying a post-annealing treatment.

The piezoelectric composition of the present invention can be utilized in, for example, piezoelectric sounders, ultrasonic sensors, piezoelectric actuators, piezoelectric transformers, film sensors, film actuators or piezoelectric ultrasonic motors. In addition, the piezoelectric composition can be applied to other elements as long as the piezoelectric composition can be used in these elements.

EXAMPLES

Hereinafter, the present invention will be further described in detail based on the examples and the comparative examples. However, the present invention is not limited to the following examples.

Example 1 to Example 8

Figure 2:
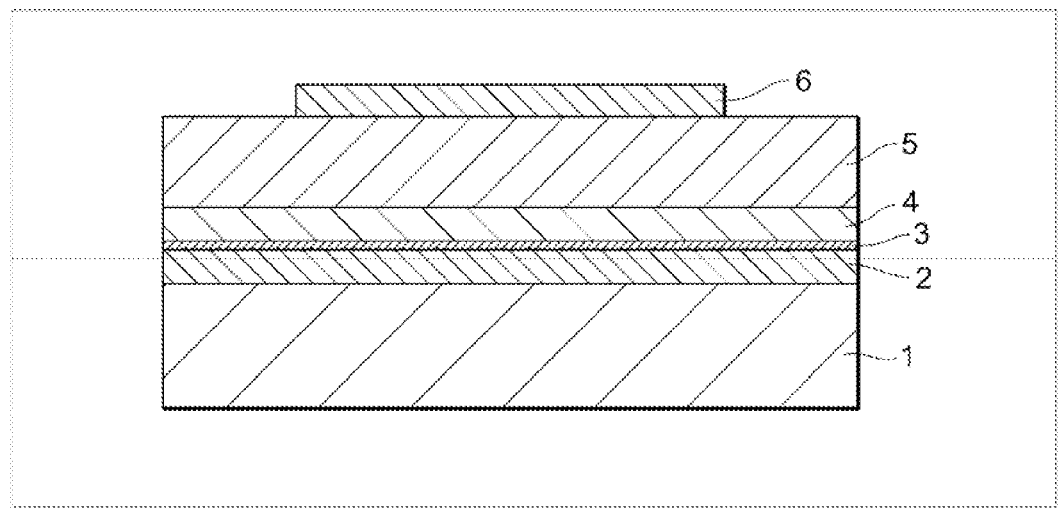
FIG. 2 is a schematic drawing showing the cross-section of the piezoelectric film element.

FIG. 2 was a cross-section view showing the structure of the piezoelectric film element in the examples. With respect to the substrate, the Si substrate 1, to which a thermal oxide film was attached, was used. The Si substrate 1 was a round substrate with its diameter of 3 inches, and it was composed of the Si substrate 1 with a (100) plane orientation and a thickness of 0.5 mm, and a thermal oxide film 2 with a thickness of 500 nm formed thereon. First of all, a Ti adhesion layer 3 and a lower electrode layer 4 were deposited on the substrate by a RF magnetron sputtering method. The lower electrode layer 4 was composed of a Ti adhesion layer 3 with a thickness of 20 nm (formed on the thermal oxide film 2) and a Pt lower electrode layer 4 deposited thereon with a thickness of 200 nm. And the Pt lower electrode layer 4 was preferably orientated in the (111) plane. The thickness of the Ti adhesion layer 3 could be properly adjusted as long as the layer could work as an adhesion layer.

The deposition condition of the Ti adhesion layer 3 and the Pt lower electrode layer 4 was that the temperature of the substrate was room temperature, sputtering power was 100 W, the introduced gas was Ar, and the sputtering pressure was 0.3 Pa.

Thereafter, a piezoelectric film 5 was deposited on the Pt lower electrode layer 4. The pulsed laser deposition method (hereinafter referred to as PLD) was used as the deposition method. The piezoelectric film 5 had a thickness of 500 nm. As the targets for PLD, a target of $(Bi_{0.5}Na_{0.5})TiO_3$, a target of $Bi(Mg_{0.5}Ti_{0.5})O_3$, and a target with an element ratio of Bi to Co being 1:1 were used. The rate of film deposition was respectively 0.02 nm/shot, 0.18 nm/shot and 0.006 nm/shot. The composition ratios shown in Table 1 were obtained by adjusting the number of shots. The condition for film deposition was as follows. Specifically, the temperature of the substrate was room temperature, the power of the laser was 60 mJ, $O_2$ was introduced and the pressure was $1.33 \times 10^{-3}$ Pa. After the film was deposited, a heat treatment was carried out for 1 minute at 900° C. under oxygen atmosphere. With these processes, piezoelectric films of the examples were obtained.

In order to evaluate the electrical properties of the piezoelectric film 5, Pt with a thickness of 100 nm was formed on the upper surface of the piezoelectric film 5 by the RF magnetron sputtering method. The film deposition condition was the same as that for the lower electrode. Then, an upper electrode 6 was formed by photolithography and etching and etc. A piezoelectric film element shown in FIG. 2 for the evaluation of electrical properties was prepared.

The spontaneous polarization [$uC/cm^2$] was evaluated as the piezoelectric properties. The spontaneous polarization was measured by using the Sawyer-Tower circuit. The spontaneous polarization was tested while an alternating current field of −50 kV/mm to +50 kV/mm was applied. Then, the maximal value Pm of spontaneous polarization was compared. The input frequency of the circuit was 1 kHz.

Further, in order to evaluate the properties as an actuator element, the displacement in the thickness direction of the film was measured by a double laser Doppler method. The method for measuring the displacement was as follows. The displacement A of the upper surface of the element (i.e. the side of the upper electrode 6 of FIG. 2) was measured while the displacement B of the lower surface (i.e. the Si substrate 1 of FIG. 2) was also measured. The desired displacement in the thickness direction of the film could be obtained by adding A to B.

The applied AC field was ±20 kV/mm. In addition, the relative displacement was obtained by dividing the obtained displacement by the thickness of the piezoelectric material.

Examples 9 to 20

As for the Examples 9 to 20, the targets for PLD were replaced by a target with an element ratio of Bi to Cr being 1:1, a target with an element ratio of Bi to Fe being 1:1, a target with an element ratio of Bi to Mn being 1:1, and a target with an element ratio of Bi, Mn and Co being 1:0.5:0.5. Piezoelectric film elements were prepared by the same method with that in Examples 1-6.

Comparative Examples 1 to 7

In Comparative Examples 1 to 7, the piezoelectric film elements were prepared by using the same method as that in Examples except that the constituent ratios of the target of $(Bi_{0.5}Na_{0.5})TiO_3$, the target of $Bi(Mg_{0.5}Ti_{0.5})O_3$ and the target with the element ratio of Bi to Co being 1:1 were changed.

Comparative Examples 8 to 11

In Comparative Examples 8 to 11, the piezoelectric film elements were prepared by using the same method as that in Examples 9 to 17 except that the constituent ratios of $(Bi_{0.5}Na_{0.5})TiO_3$, $Bi(Mg_{0.5}Ti_{0.5})O_3$, $BiCrO_3$, $BiFeO_3$ and $BiMnO_3$ were changed.

The results of the maximal value Pm of spontaneous polarization and the displacement were shown in Table 1.

TABLE 1

| Sample No. | | Additive element Me | Constituent ratio x of $(Bi_{0.5}Na_{0.5})TiO_3$ | Constituent ratio y of $Bi(Mg_{0.5}Ti_{0.5})O_3$ | Constituent ratio z of $BiMeO_3$ | Pm [$uC/cm^2$] | Displacement [%] |
|---|---|---|---|---|---|---|---|
| 1 | Example 1 | Co | 0.63 | 0.36 | 0.01 | 27 | 0.044 |
| 2 | Example 2 | Co | 0.26 | 0.69 | 0.05 | 26 | 0.043 |
| 3 | Example 3 | Co | 0.05 | 0.70 | 0.25 | 32 | 0.052 |
| 4 | Example 4 | Co | 0.68 | 0.02 | 0.30 | 23 | 0.038 |
| 5 | Example 5 | Co | 0.05 | 0.52 | 0.43 | 41 | 0.067 |
| 6 | Example 6 | Co | 0.53 | 0.01 | 0.46 | 38 | 0.062 |
| 7 | Example 7 | Co | 0.37 | 0.04 | 0.59 | 48 | 0.079 |

TABLE 1-continued

| Sample No. | Additive element Me | Constituent ratio x of $(Bi_{0.5}Na_{0.5})TiO_3$ | Constituent ratio y of $Bi(Mg_{0.5}Ti_{0.5})O_3$ | Constituent ratio z of $BiMeO_3$ | Pm [μC/cm$^2$] | Displacement [%] |
|---|---|---|---|---|---|---|
| 8 Example 8 | Co | 0.32 | 0.12 | 0.56 | 48 | 0.079 |
| 9 Example 9 | Cr | 0.63 | 0.36 | 0.01 | 24 | 0.039 |
| 10 Example 10 | Mn | 0.63 | 0.36 | 0.01 | 26 | 0.043 |
| 11 Example 11 | Fe | 0.63 | 0.36 | 0.01 | 23 | 0.038 |
| 12 Example 12 | Co:Mn = 1:1 | 0.63 | 0.36 | 0.01 | 25 | 0.041 |
| 13 Example 13 | Cr | 0.05 | 0.52 | 0.43 | 37 | 0.061 |
| 14 Example 14 | Mn | 0.05 | 0.52 | 0.43 | 36 | 0.059 |
| 15 Example 15 | Fe | 0.05 | 0.52 | 0.43 | 35 | 0.057 |
| 16 Example 16 | Co:Mn = 1:1 | 0.05 | 0.52 | 0.43 | 36 | 0.059 |
| 17 Example 17 | Cr | 0.37 | 0.04 | 0.59 | 45 | 0.074 |
| 18 Example 18 | Mn | 0.37 | 0.04 | 0.59 | 45 | 0.074 |
| 19 Example 19 | Fe | 0.37 | 0.04 | 0.59 | 43 | 0.070 |
| 20 Example 20 | Co:Mn = 1:1 | 0.37 | 0.04 | 0.59 | 45 | 0.074 |
| 21 Comparative Example 1 | Co | 1.00 | 0.00 | 0.00 | 11 | 0.018 |
| 22 Comparative Example 2 | Co | 0.73 | 0.26 | 0.01 | 14 | 0.023 |
| 23 Comparative Example 3 | Co | 0.47 | 0.53 | 0.00 | 12 | 0.020 |
| 24 Comparative Example 4 | Co | 0.25 | 0.73 | 0.02 | Unmeasurable due to leakage | — |
| 25 Comparative Example 5 | Co | 0.04 | 0.48 | 0.48 | Unmeasurable due to leakage | — |
| 26 Comparative Example 6 | Co | 0.10 | 0.25 | 0.65 | Unmeasurable due to leakage | — |
| 27 Comparative Example 7 | Co | 0.25 | 0.05 | 0.70 | Unmeasurable due to leakage | — |
| 28 Comparative Example 8 | Cr | 0.73 | 0.26 | 0.01 | 12 | 0.020 |
| 29 Comparative Example 9 | Mn | 0.73 | 0.26 | 0.01 | 13 | 0.021 |
| 30 Comparative Example 10 | Fe | 0.73 | 0.26 | 0.01 | 11 | 0.018 |
| 31 Comparative Example 11 | Co:Mn = 1:1 | 0.73 | 0.26 | 0.01 | 12 | 0.020 |

As shown in Table 1, when the range of the constituent ratio x of $(Bi_{0.5}Na_{0.5})TiO_3$ satisfied $0.05 \leq x \leq 0.7$, the range of the constituent ratio y of $Bi(Mg_{0.5}Ti_{0.5})O_3$ satisfied $0.01 \leq y \leq 0.7$, the range of the constituent ratio z of $BiCoO3$ satisfied $0.01 \leq z \leq 0.6$ and $x+y+z=1$, the maximal value Pm of spontaneous polarization was 2.0 times or more of that in Comparative Example 1.

Further, as shown in Examples 5 to 6, when the range of the constituent ratio x of $(Bi_{0.5}Na_{0.5})TiO_3$ satisfied $0.05 \leq x \leq 0.6$, the range of the constituent ratio y of $Bi(Mg_{0.5}Ti_{0.5})O_3$ satisfied $0.01 \leq y \leq 0.7$, the range of the constituent ratio z of $BiCoO_3$ satisfied $0.4 \leq z \leq 0.6$ and $x+y+z=1$, the maximal value Pm of spontaneous polarization was 3.0 times or more of that in Comparative Example 1.

Further, as shown in Examples 7 to 8, when the range of the constituent ratio x of $(Bi_{0.5}Na_{0.5})TiO_3$ satisfied $0.2 \leq x \leq 0.5$, the range of the constituent ratio y of $Bi(Mg_{0.5}Ti_{0.5})O_3$ satisfied $0.01 \leq y \leq 0.3$, the range of the constituent ratio z of $BiCoO_3$ satisfied $0.5 \leq z \leq 0.6$ and $x+y+z=1$, the maximal value Pm of spontaneous polarization was 4.0 times or more of that in Comparative Example 1.

In addition, in order to compare the properties used as a piezoelectric actuator, the obtained displacements were compared. As shown in Table 1, the result was known that when the range of the constituent ratio x of $(Bi_{0.5}Na_{0.5})TiO_3$ satisfied $0.05 \leq x \leq 0.7$, the range of the constituent ratio y of $Bi(Mg_{0.5}Ti_{0.5})O_3$ satisfied $0.01 \leq y \leq 0.7$, the range of the constituent ratio z of $BiCoO_3$ satisfied $0.01 \leq z \leq 0.6$ and $x+y+z=1$, the displacement was increased by 2.0 times to 4 times or more when compared to Comparative Example 1 and the piezoelectric properties could be improved. As a result, it was known that the properties could be improved when used as an actuator element.

Examples 21 to 24 and Comparative Examples 11 to 12

Further, the compositions shown in Table 2 were discussed so as to study the range of the ratio of A to B (i.e. the value of m).

In Examples 21 to 24 and Comparative Examples 11 to 12, the target of $(Bi_{0.5}Na_{0.5})_mTiO_3$ and the target of $Bi(Mg_{0.5}Ti_{0.5})_mO_3$ were prepared, wherein the ratios of A to B (i.e., the value of m) were changed. Then, the target with the element ratio of Bi to Co being m:1 was prepared. Thus, the piezoelectric film elements were prepared by using the same method as that of Examples.

TABLE 2

| Samples No. | Constituent ratio x of $(Bi_{0.5}Na_{0.5})TiO_3$ | Constituent ratio y of $Bi(Mg_{0.5}Ti_{0.5})O_3$ | Constituent ratio z of $BiCoO_3$ | m | Pm [μC/cm$^2$] |
|---|---|---|---|---|---|
| 32 Example 21 | 0.37 | 0.04 | 0.59 | 1.00 | 47 |
| 33 Example 22 | 0.37 | 0.04 | 0.59 | 0.90 | 43 |
| 34 Example 23 | 0.37 | 0.04 | 0.59 | 0.80 | 45 |
| 35 Example 24 | 0.37 | 0.04 | 0.59 | 0.75 | 43 |
| 36 Comparative Example 12 | 0.37 | 0.04 | 0.59 | 1.01 | 12 |
| 37 Comparative Example 13 | 0.37 | 0.04 | 0.59 | 0.73 | 13 |

As shown in Table 2, when m was smaller than 0.75, the maximal value Pm of spontaneous polarization became smaller due to the generation of the heterogeneous phases. On the other hand, when m was larger than 1.00, the maximal value Pm of spontaneous polarization also became smaller due to the abnormal grain growth and etc.

As a thin film deposition method of the piezoelectric film, the PLD method had been described. However, any one of the sputtering method, the solution method and the CVD (chemical vapor deposition) method could also be used.

Further, it had been confirmed that the same effect could be achieved even if the piezoelectric element in which the piezoelectric composition was used was prepared by the solid-phase reaction method.

The present invention has been described by providing the embodiments and examples above, but the present invention is not limited thereto. In the embodiments and examples described above, only the case in which the first and the second compounds are contained has been described. However, other compounds also can be contained therein.

The piezoelectric composition of the present invention can be widely utilized in the fields of the actuator, the sensor or the resonator.

DESCRIPTION OF REFERENCE NUMERALS

1 Si substrate
2 Thermal oxide film
3 Ti adhesion layer
4 Lower electrode
5 Piezoelectric film
6 Upper electrode

What is claimed is:

1. A piezoelectric composition comprising the material represented by the following formula with a perovskite type structure as the main component, $$(Bi_{(0.5x+y+z)}Na_{0.5x})_m(Ti_{(x+0.5y)}Mg_{0.5y}Me_z)O_3$$

wherein, $0.05 \leq x \leq 0.7$, $0.01 \leq y \leq 0.7$, $0.01 \leq z \leq 0.6$, $0.75 \leq m \leq 1.0$, $x+y+z=1$ and the transition metal element Me is any one or more selected from the group consisting of Mn, Cr, Fe and Co.

2. A piezoelectric element comprising said piezoelectric composition according to claim 1 and electrodes for applying voltage.

* * * * *